(12) United States Patent
Podval et al.

(10) Patent No.: US 9,101,058 B2
(45) Date of Patent: Aug. 4, 2015

(54) IC PACKAGE AND ASSEMBLY

(71) Applicant: Marvell World Trade Ltd., St. Michael (BB)

(72) Inventors: Shimon Podval, Rishon LeZion (IL); Amihud Rothmann, Haifa (IL)

(73) Assignee: Marvell World Trade Ltd., St. Michael (BB)

( * ) Notice: Subject to any disclaimer, the term of this patent is extended or adjusted under 35 U.S.C. 154(b) by 141 days.

(21) Appl. No.: 13/944,546

(22) Filed: Jul. 17, 2013

(65) Prior Publication Data
US 2014/0022736 A1   Jan. 23, 2014

Related U.S. Application Data

(60) Provisional application No. 61/672,422, filed on Jul. 17, 2012, provisional application No. 61/710,430, filed on Oct. 5, 2012.

(51) Int. Cl.
| | |
|---|---|
| H05K 5/00 | (2006.01) |
| H05K 1/02 | (2006.01) |
| H05K 3/30 | (2006.01) |
| H05K 1/18 | (2006.01) |

(52) U.S. Cl.
CPC ............ *H05K 1/0296* (2013.01); *H05K 1/183* (2013.01); *H05K 3/30* (2013.01); *H05K 2201/09181* (2013.01); *H05K 2201/10734* (2013.01); *Y10T 29/49128* (2015.01)

(58) Field of Classification Search
CPC ........................................................ H05K 1/182
USPC ........................................................... 361/761
See application file for complete search history.

(56) References Cited

U.S. PATENT DOCUMENTS

| | | | |
|---|---|---|---|
| 6,175,158 B1 * | 1/2001 | Degani et al. ................. 257/777 |
| 2004/0233651 A1 * | 11/2004 | Liu et al. ........................ 361/766 |
| 2005/0117314 A1 * | 6/2005 | Lien ............... 361/761 |
| 2005/0121224 A1 * | 6/2005 | Lien .............................. 174/250 |
| 2012/0281375 A1 * | 11/2012 | Hsu ............................... 361/761 |
| 2012/0314390 A1 * | 12/2012 | Chang .......................... 361/761 |
| 2013/0121523 A1 * | 5/2013 | Pahl .............................. 381/361 |
| 2014/0133118 A1 * | 5/2014 | Sano ............................. 361/761 |

* cited by examiner

*Primary Examiner* — Forrest M Phillips

(57) ABSTRACT

Aspects of the disclosure provide a circuit that includes a printed circuit board (PCB) substrate formed with an opening portion that is dimensioned to accommodate an integrated circuit (IC) package. When the IC package is disposed in the opening portion and is electrically coupled to the PCB substrate for PCB assembling, a thickness of the assembled PCB is less than a thickness sum of the IC package and the PCB substrate.

17 Claims, 5 Drawing Sheets

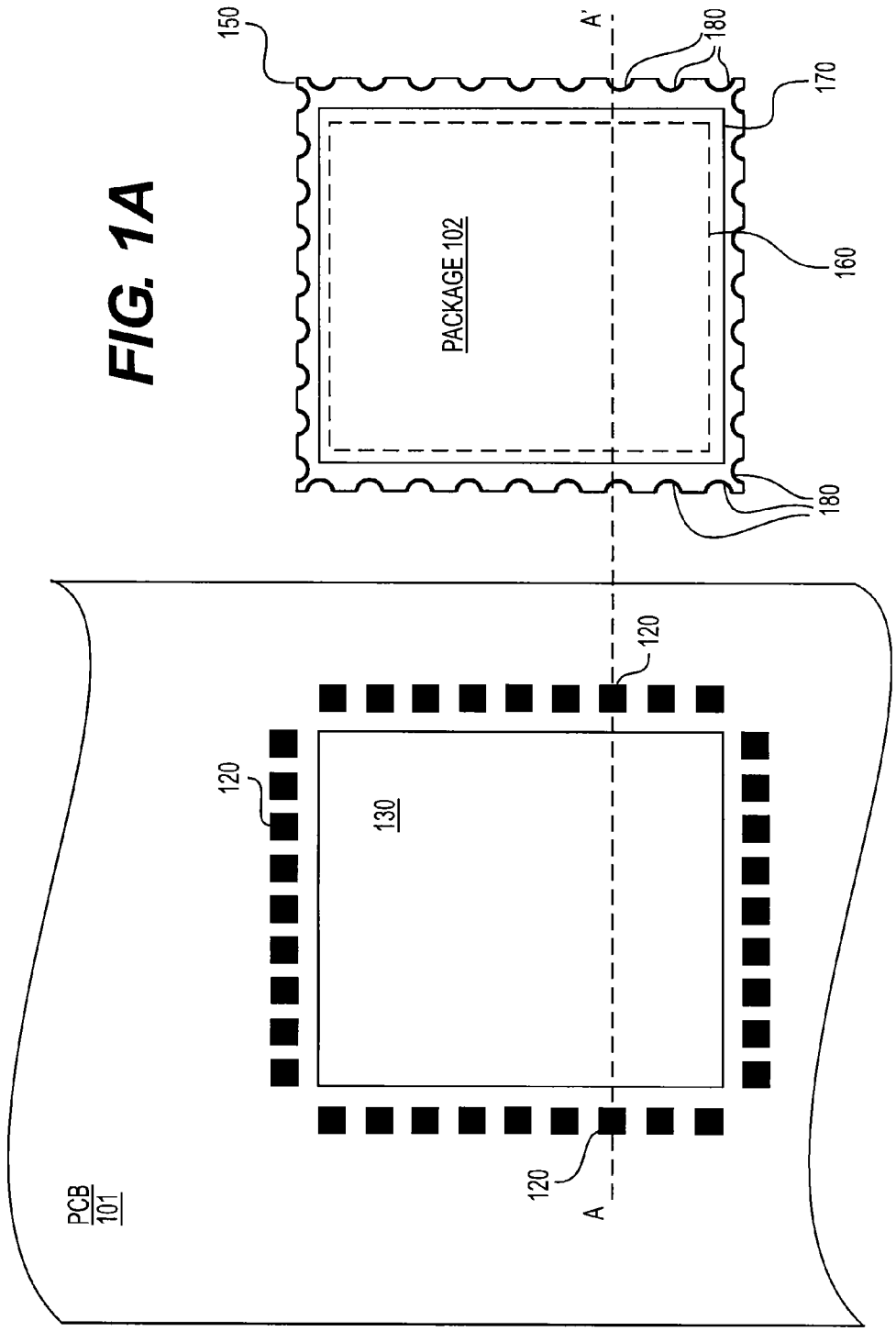

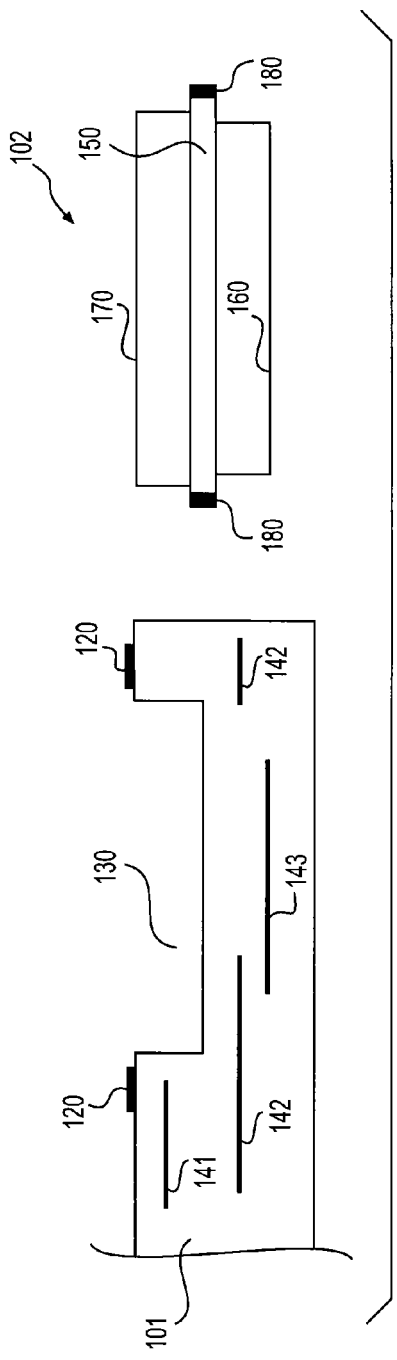
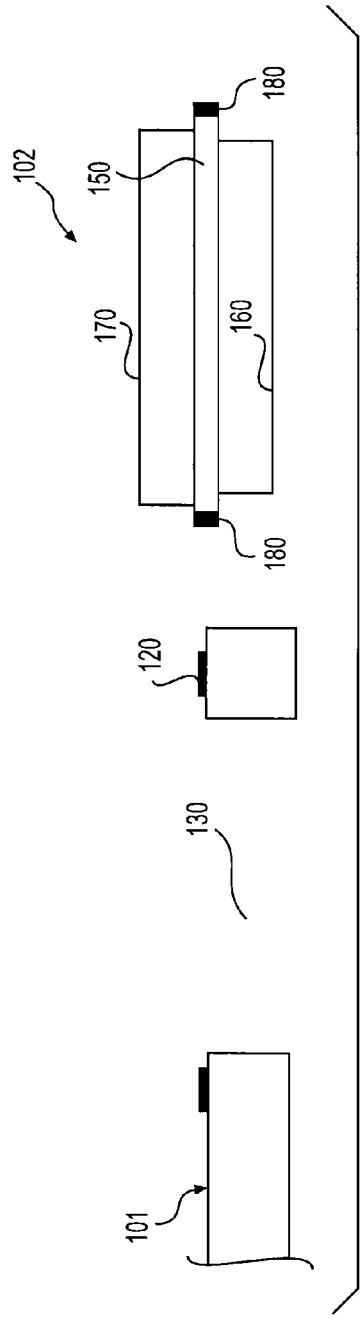
FIG. 1B
FIG. 1C

IC PACKAGE AND ASSEMBLY

INCORPORATION BY REFERENCE

This present disclosure claims the benefit of U.S. Provisional Application No. 61/672,422, "DOUBLE SIDED STAMP IC MODULE" filed on Jul. 17, 2012, and U.S. Provisional Application No. 61/710,430, "PARTIAL PCB CUTOUT FOR DOUBLE SIDED STAMP MODULE ASSEMBLY" filed on Oct. 5, 2012, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Multiple integrated circuits (IC) chips can be packaged together to form a multi-chip module (MCM). When the multiple IC chips are placed side by side, the MCM package may have a relatively large surface area, and when the multiple IC chips are stacked, the MCM package may have a relatively tall height.

SUMMARY

Aspects of the disclosure provide a circuit that includes a printed circuit board (PCB) substrate formed with an opening portion that is dimensioned to accommodate an integrated circuit (IC) package. When the IC package is disposed in the opening portion and is electrically coupled to the PCB substrate for PCB assembling, a thickness of the assembled PCB is less than a thickness sum of the IC package and the PCB substrate.

In an embodiment, the IC package includes an interposer and one or more IC components mounted on at least one side of the interposer, and the interposer includes a plurality of conductive components configured to electrically couple the IC package to the PCB substrate when the conductive components are aligned with corresponding conductive components on the PCB substrate.

In an example, the IC package includes a first IC chip and a second IC chip respectively mounted on a first side and a second side of the interposer. Further, an outline portion of the interposer is notched and at least partially plated to form the conductive components electrically coupling the interposer to the PCB substrate.

According to an aspect of the disclosure, the IC package is electrically coupled with the PCB substrate via at least one of wire bonding connections, plated connections, and ball-grid array connections. Further, the opening portion can be a through opening or a partial opening.

In an example, the opening portion is a partial opening, the IC components are mounted on a first side of the interposer, and the conductive components are solder balls disposed on a second side of the interposer, and the interposer is configured to fit into the partial opening with the solder balls being electrically coupled to a layer of the PCB underlying the partial opening.

Aspects of the disclosure provide a method that includes forming a substrate of a printed circuit board (PCB) with an opening portion that is dimensioned to accommodate an integrated circuit (IC) package, and disposing the IC package in the opening portion to assemble the IC package into the PCB, and a thickness of the assembled PCB being less than a thickness combination of the IC package and the substrate.

Aspects of the disclosure provide an integrated circuit (IC) package. The IC package includes a first integrated circuit (IC) chip mounted on a first side of an interposer with dimensions being fittable into an opening on a printed circuit board (PCB) substrate, and a plurality of conductive components disposed on the interposer configured for electrically coupling the IC package with the PCB substrate. When the IC package is disposed and assembled on the PCB substrate, a thickness of the assembled PCB is less than a thickness sum of the IC package and the PCB substrate.

BRIEF DESCRIPTION OF THE DRAWINGS

Various embodiments of this disclosure that are proposed as examples will be described in detail with reference to the following figures, wherein like numerals reference like elements, and wherein:

FIGS. 1A-1D show diagrams of a printed circuit board substrate example and an integrated circuit (IC) package example according to an embodiment of the disclosure;

DETAILED DESCRIPTION OF EMBODIMENTS

Figure 1D:
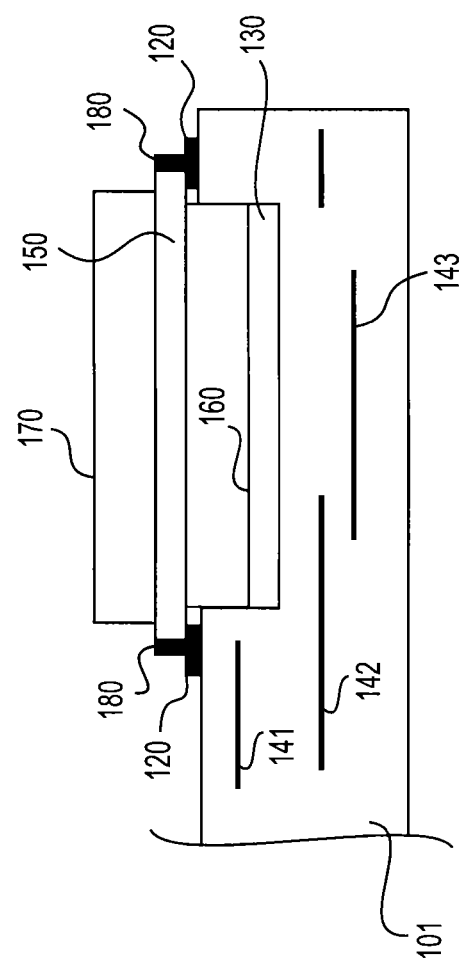

FIG. 1A shows a surface view for a printed circuit board (PCB) substrate 101 and an integrated circuit (IC) package 102 according to an embodiment of the disclosure. The PCB substrate 101 includes an opening portion 130 into the surface. The opening portion 130 is dimensioned to accommodate the IC package 102. The IC package 102 includes an interposer 150 and an IC chip mounted on a side of the interposer 150 to form a portion 160 that extended above the first side of the substrate, in accordance with an embodiment. The portion 160 is fit-able to be disposed into the opening portion 130. When the IC package 102 is assembled on the PCB substrate 101, the portion 160 fits into the opening portion 130 to reduce a thickness of the assembled PCB. Further, the PCB substrate 101 includes conductive connectors, such as lands 120, and the IC chip package 102 includes conductive connectors 180 that in an embodiment are aligned with the lands 120 to form electrical connections when the IC package 102 is assembled into the PCB substrate 101.

According to an embodiment of the disclosure, the opening portion 130 is a through opening without any PCB layers. In accordance with another embodiment, the opening portion 130 is a partial opening with a few PCB layers, namely less than all PCB layers, underlying the opening portion 130.

FIG. 1B shows a cross-section view along A-A' for the PCB substrate 101 and the IC package 102 according to an embodiment of the disclosure. In this embodiment, the opening portion 130 is a partial opening with a few PCB layers, less than all of the PCB layers, underlying the opening.

FIG. 1C shows a cross-section view along A-A' for the PCB substrate 101 and the IC package 102 according to another embodiment of the disclosure. In this embodiment, the opening portion 130 is a through opening without any PCB layers.

FIG. 1D shows a cross-section diagram of the PCB substrate 101 and the IC package 102 assembled together. In FIG.

1D, the opening portion 130 is a partial opening with a few PCB layers, less than all of the PCB layers, underlying the opening.

Generally, an electronic device, such as a cell phone, a tablet, a laptop computer, and the like, includes one or more assembled PCB boards that have various electronic components, such as discrete components, integrated components, and the like, mounted on the PCB boards. In an embodiment, the size and thickness of the assembled PCB boards affect the size and thickness of the electronic device. Thus, the assembled PCB boards need to meet a size requirement and a thickness requirement.

The IC package 102 can be any suitable package, such as a single IC chip package, a multi-chip module (MCM) package, and the like. In an embodiment, the IC package 102 is multi-chip module (MCM) package that includes multiple IC chips stacked to reduce a footprint.

Specifically, in an example, the interposer 150 in the IC package 102 has a first side (e.g., the bottom side in FIGS. 1A-1D) and a second side (e.g., the upper side in FIGS. 1A-1D). The interposer 150 is a PCB substrate of a relatively smaller size compared to the PCB substrate 101, in an embodiment. On the first side, one or more IC chips are mounted on the interposer 150, for example using flip-chip technologies, to form a first portion 160 extended above the first side of the interposer 150; and on the second side, one or more IC chips are mounted on the interposer 150, for example using flip-chip technologies, to form a second portion 170 extended above the second side of the interposer 150. The IC chips mounted on the interposer 150 are any suitable IC chips. In an example, the IC package 102 is a modem that includes one or more IC chips for baseband processing, and one or more IC chips for radio frequency processing. For example, the baseband processing chips are mounted on the first side to form the first portion 160, and the radio frequency (RF) processing chips are mounted on the second side to form the second portion 170. In an embodiment, the IC package 102 includes other suitable chip, such as a power management chip, and the like, mounted on the first side or the second side of the interposer 150. It is noted that, in an example, the IC chips are encapsulated with the interposer 150 to form the IC package 102. The first portion 160 and the second portion 170 can have the same shape and size or can have different shapes or sizes.

According to an embodiment of the disclosure, because both sides of the interposer 150 are used for mounting IC chips, the IC package 102 is implemented with a relatively small footprint but a relatively large thickness compared to a single side mounting technology in an example.

Further, the IC package 102 includes interface connectors implemented on the interposer 150. In an example, the size of the interposer 150 is larger than the first portion 160 and the second portion 170 by a margin, and the interface connectors are implemented on the margin. The interface connectors can be implemented using any suitable technology, such as pins, solder balls, plated connectors, and the like. The interface connectors are electrically connected with the IC chips mounted on the interposer 150 via printed circuits on the interposer 150 for example. The interface connectors are configured to form electrically couplings with corresponding connectors on a PCB substrate when the IC package 102 is assembled on the PCB substrate, such as the PCB substrate 101. The interface connectors and the corresponding connectors on the PCB substrate can be coupled together via any suitable connections, such as wire bonding connections, plated connections, ball-grid array connections, and the like.

In the FIGS. 1A-1D example, plated connectors 180 are formed on the margin of the interposer 150. Specifically, the interposer 150 is shaped in a stamp card that has a plurality of notches, such as half through holes, along the outlines of the interposer 150. The notches are plated of one or more conductive layers, such as a copper layer and the like to form the plated connectors 180. In an example, the connective layer covers the surface in the notches and extends to the notch edges on one or both sides of the interposer 150. In an example, the plated connectors 180 are formed similarly to through-holes with pads. It is noted that, in an example, the plated connectors 180 are isolated from each other by the non-plated portion of the interposer 150. It is also noted that the plated connectors 180 can have other suitable configuration, such as plated fingers, and the like.

The PCB board substrate 101 includes various layers, such as isolation layers, metal layers and the like stacked together. The metal layers are patterned to provide routings to electronic components mounted on the PCB board substrate 101, the isolation layers are placed between the metal layers to provide electrical isolation. Further, the opening portion 130 is formed into the surface of the PCB board substrate 101. The opening portion 130 can be formed by any suitable technique, such as cut-out, etching, ablation, molding, and the like. In an embodiment, suitable layers of the PCB board substrate 101 are respectively formed with openings, and then the layers are aligned and stacked to form the PCB board substrate 101 with the opening portion 130. In another embodiment, the layers of the PCB board substrate 101 are respectively formed without the openings, and the layers are stacked to build up the PCB board substrate 101. Then, the opening portion 130 is formed after the PCB board substrate 101 is built-up. The opening portion 130 is dimensioned to accommodate the first portion 160, and thus the first portion 160 can fit into the opening portion 130.

In an embodiment, the opening portion 130 is a partial opening portion, such as seen in FIG. 1B. In the FIG. 1B example, the PCB substrate 101 includes metal layers 141, 142 and 143 within the PCB substrate 101. It is noted that, in an example, the PCB substrate 101 has metal layers on the surfaces of the PCB substrate 101. Due to the opening portion 130, the metal layer 141 does not exist in the opening portion 130. However, the metal layers 142 and 143 still exist under the opening portion 130, and thus the metal layers 142 and 143 are patterned and used for routing purpose.

In another embodiment, the opening portion 130 is a through opening portion, such as shown in FIG. 1C. In the FIG. 1C example, all the layers of the PCB substrate 101 do not exist in the opening portion 130.

According to an aspect of the disclosure, the plurality of lands 120 is formed to match with the interface connectors of the IC packages 102, such as the plated connectors 180. For example, the plurality of lands 120 is formed on the PCB substrate 101 with a margin to the opening portion 130. The lands 120 are formed of conductive material, such as copper, and the like and are electrically connected to wires formed of the patterned metal layers of the PCB substrate 101. Further, the lands 120 are positioned to be aligned with the interface connectors of the IC package 102, such as the plated connectors 180.

According to the disclosure, to assemble the IC package 102 on the PCB substrate 101, the first portion 160 fits into the opening portion 130, and then the plated connectors 180 are aligned with the lands 120 and in contact with the lands 120, as shown in FIG. 1D. In an embodiment, when a plated connector 180 is in contact with a land 120, the plated connector 180 and the land 120 form electrical connection. In another embodiment, the plated connector 180 and the land 120 are soldered together by melting and flowing a filler metal into the notch of the plated connector 180.

According to an aspect of the disclosure, because the first portion 160 can fit into the opening portion 130, the thickness of the assembled PCB is less than a thickness sum of the IC package 102 and the PCB substrate 101. In an example, the thickness of one IC chip is about 1 mm, and the thickness of the IC package substrate 102 is about 2 mm. In an embodiment, the thickness specification for an electronic device allows about 1 mm thickness addition to the thickness of a PCB substrate. When the first portion 160 fits into the opening portion 130, the thickness of the assembled PCB is about 1 mm in addition to the thickness of the PCB substrate 101, and satisfies the thickness specification.

Figure 2:
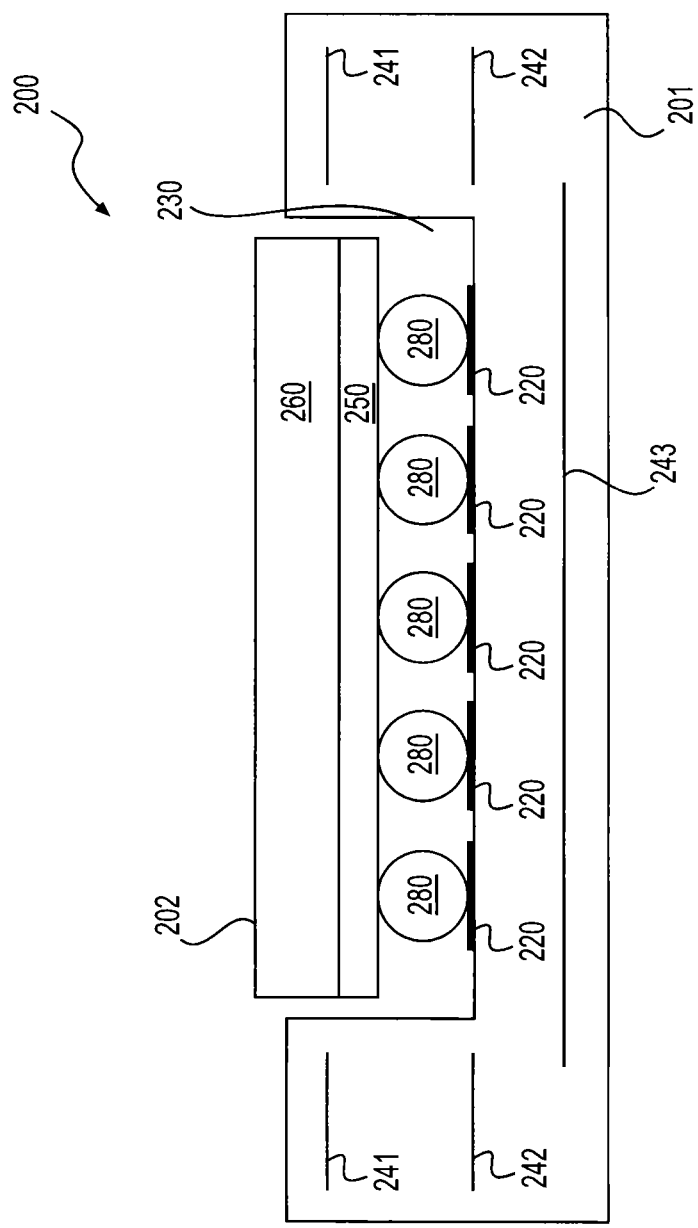
FIG. 2 shows a cross-section diagram of an assembled printed circuit board example according to an embodiment of the disclosure.

FIG. 2 shows a cross-section diagram of an assembled PCB example 200 according to an embodiment of the disclosure. The PCB 200 includes a PCB substrate 201 and an IC package 202. The PCB substrate 201 includes an opening portion 230 into the surface. The opening portion 230 is dimensioned to accommodate the IC package 202. The IC package 202 includes an interposer 250 and an IC chip mounted on a side of the interposer 250. The IC package 202 is fit-able to be disposed into the opening portion 230. When the IC package 202 is assembled on the PCB substrate 201, the IC package 202 fits into the opening portion 230 to reduce a thickness of the assembled PCB 200.

Further, the PCB substrate 201 includes conductive connectors, such as lands 220, and the IC chip package 202 includes conductive connectors 280 that can be aligned with the lands 220 to form electrical connections when the IC package 202 is assembled into the PCB substrate 201.

In the FIG. 2 example, the opening portion 230 is a partial opening with a few PCB layers, less than all of the PCB layers, underlying the opening portion 230.

The IC package 202 can be any suitable package, such as a single IC chip package, a multi-chip module (MCM) package, and the like. In an embodiment, the IC package 202 is multi-chip module (MCM) package that includes multiple IC chips stacked to reduce a footprint. In an example, the IC package 202 includes an interposer 250 having a first side and a second side. In an example, the interposer 250 is a suitable PCB-like substrate of a relatively smaller size compared to the PCB substrate 201. On the first side, one or more IC chips are mounted on the interposer 250, for example using flip-chip technologies, to form a first portion 260 extended above the first side of the interposer 250. In an example, the IC chips are mounted side by side on the first side of the interposer 250. In another example, the IC chips are stacked together and the stacked IC chips are mounted on the first side of the interposer 250.

Further, the IC package 202 includes interface connectors implemented on the interposer 250. In an example, the IC package 202 is a ball grid array package that has a plurality of solder balls 280 arranged in an array. The solder balls 280 are electrically connected with the IC chips mounted on the interposer 250. The solder balls 280 are configured to form electrical couplings with corresponding connectors on the PCB substrate 201 when the IC package 202 is assembled on the PCB substrate 201.

The PCB board substrate 201 includes various layers, such as isolation layers, metal layers and the like stacked together. The metal layers are patterned to provide routings to electronic components mounted on the PCB board substrate 201, the isolation layers are placed between the metal layers to provide electrical isolation. Further, the opening portion 230 is formed into the surface of the PCB board substrate 201. The opening portion 230 can be formed by any suitable technique, such as cut-out, etching, and the like. The PCB substrate 201 includes metal layers 241, 242 and 243 within the PCB substrate 201. It is noted that, in an example, the PCB substrate 201 has metal layers on the surfaces of the PCB substrate 201. Due to the opening portion 230, the metal layer 241 does not exist in the opening portion 230. However, the metal layer 243 still exists under the opening portion 230, and thus the portion of the metal layer 243 under the opening portion 230 is patterned and used for routing purpose.

According to an aspect of the disclosure, the plurality of lands 220 is formed to match with the solder balls 280 of the IC packages 202. For example, the plurality of lands 220 is formed on a metal layer underlying the opening portion 230. In an example, the lands 220 are formed of the metal layer 242. The lands 220 are positioned to be able to align with the solder balls 280.

According to the disclosure, to assemble the IC package 202 on the PCB substrate 201, the IC package 202 fits into the opening portion 230, and then the solder balls 280 are aligned with the lands 220 and in contact with the lands 220 to form the electrical connections. In an embodiment, suitable technique is used to apply reflow solder on the lands 220 to enable the formation of the electrical connections. In an example, reflow solder is applied using masks. In an example, one or more masks are respectively dimensioned to allow the reflow solder to be applied on the lands 220. In another example, a suitable dropper is used to apply the reflow solder on the lands 220.

According to an aspect of the disclosure, because the IC package 202 fits into the opening portion 230, the thickness of the assembled PCB is less than a thickness sum of the IC package 202 and the PCB substrate 201.

Figure 3:
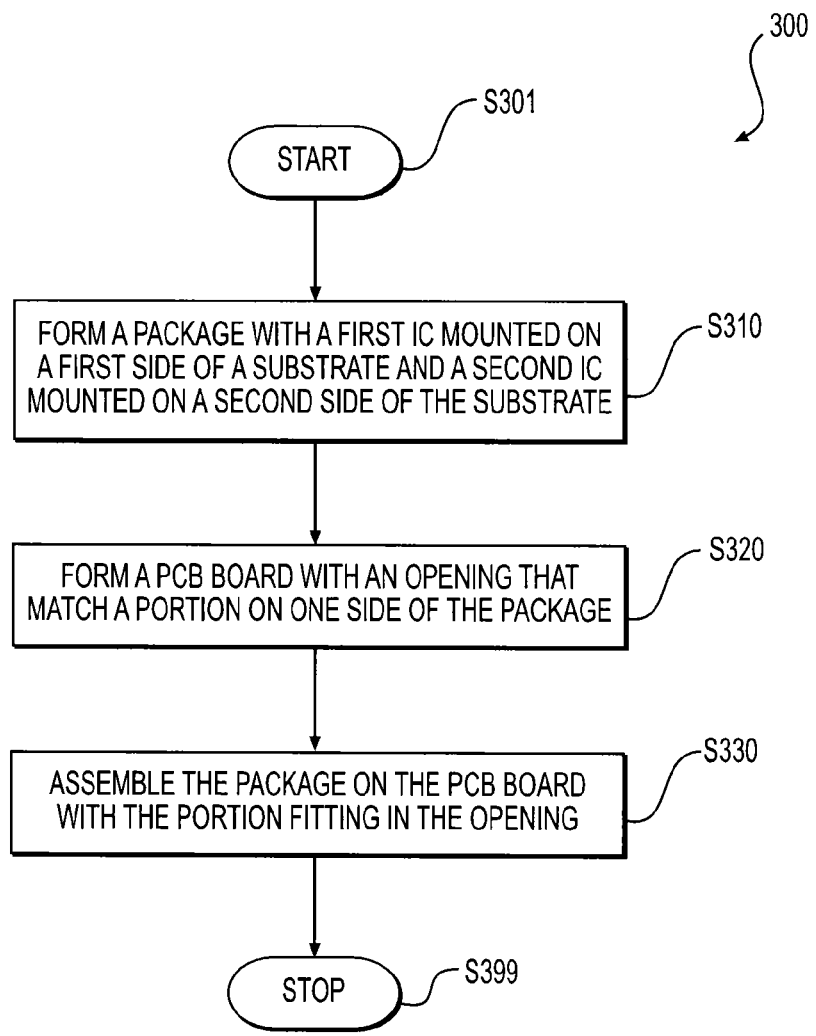
FIG. 3 shows a flowchart outlining a process example according to an embodiment of the disclosure.

FIG. 3 shows a flowchart outlining a process example according to an embodiment of the disclosure. In an example, the process is used to implement an assembled PCB. The process starts at S301 and proceeds to S310.

At S310, an IC package is formed. In an example, to form the IC package 102, the interposer 150 is shaped to have notches in the outlines of the interposer 150 and the notches are plated to form the plated connectors 180. Further, in an example, the baseband processing IC chips are mounted on the first side of the interposer 150 to form the first portion 160, and the radio frequency processing IC chips are mounted on the second side of the interposer 150. In another example, the IC package 202 is formed. The IC package 202 is a ball grid array type package that includes the solder balls 280 on a side of the interposer 250.

At S320, a PCB substrate with an opening is formed. The opening is dimensioned to accommodate an IC package or a portion of the IC package. In an example, the PCB substrate 101 is formed with the opening portion 130. The opening portion 130 can be a through opening or a partial opening. The opening portion 130 matches the shape and size of the first portion 160 of the IC package 102. Further, the PCB substrate 101 includes the lands 120 formed on a margin portion of the PCB substrate 101 to the opening portion 130. The lands 120 are configured to be align-able with the plated connectors 180. In another example, the PCB substrate 201 is formed with the opening portion 230. The opening portion 230 is a partial opening that accommodates the IC package 202. Further, the PCB substrate 201 includes lands 220 formed underlying the partial opening. The lands 220 are configured to be align-able with the solder balls 280.

At S330, the package is assembled on the PCB substrate. In an example, to assemble the IC package 102 onto the PCB substrate 101, the first portion 160 fits into the opening portion 130 to reduce the thickness of the assembled PCB. Then, the plated connectors 180 of the IC package 102 are aligned with the lands 120 on the PCB substrate 101 and are in contact with the lands 120 to form electrical connections. In an example, the plated connectors 180 are soldered with the lands 120 to form the electrical connections. Thus, the IC package 102 is assembled on the PCB substrate 101, and the thickness of the assembled PCB is less than the thickness sum of the IC package 102 and the PCB substrate 101. In another example, the IC package 202 is disposed in the opening portion 230, and the solder balls 280 are aligned and in contact with the lands 220 to form the assembled PCB 200. The thickness of the assembled PCB 200 is less than the thickness sum of the IC package 202 and the PCB substrate 201. Then, the process proceeds to S399 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
    an integrated circuit (IC) package that includes an interposer having an outline portion that is notched with each notch at least partially plated to form conductive components within the notches;
    a printed circuit board (PCB) substrate formed with an opening portion that is dimensioned to accommodate the IC package; and
    wherein when the IC package is disposed in the opening portion and is electrically coupled to the PCB substrate for PCB assembling, a thickness of the assembled PCB is less than a thickness sum of the IC package and the PCB substrate.

2. The circuit of claim 1, wherein the IC package includes the interposer and one or more IC components mounted on at least one side of the interposer, and the interposer includes the plurality of conductive components configured to electrically couple the IC package to the PCB substrate when the conductive components are aligned with corresponding conductive components on the PCB substrate.

3. The circuit of claim 2, wherein the IC package includes a first IC chip and a second IC chip respectively mounted on a first side and a second side of the interposer.

4. The circuit of claim 1, wherein the IC package is electrically coupled to the PCB substrate via at least one of wire bonding connections, plated connections, and ball-grid array connections.

5. The circuit of claim 1, wherein the opening portion is a through opening or a partial opening.

6. The circuit of claim 2, wherein the opening portion is a partial opening, the IC components are mounted on a first side of the interposer, and the conductive components are solder balls disposed on a second side of the interposer, and the interposer is configured to fit into the partial opening with the solder balls being electrically coupled to a layer of the PCB underlying the partial opening.

7. A method, comprising:
    forming a substrate of a printed circuit board (PCB) with an opening portion that is dimensioned to accommodate an integrated circuit (IC) package;
    mounting one or more IC components on at least one side of an interposer;
    forming notches in an outline portion of the interposer;
    plating the notches to form conductive components; and
    disposing the IC package in the opening portion to assemble the IC package into the PCB, and a thickness of the assembled PCB being less than a thickness combination of the IC package and the substrate.

8. The method of claim 7, further comprising forming the IC package, wherein forming the IC package further comprises:
    forming the plurality of conductive components on the interposer to electrically couple the IC package to the substrate when the conductive components are aligned with corresponding conductive components on the substrate.

9. The method of claim 8, wherein mounting the one or more IC components on at least one side of the interposer further comprises:
    mounting a first IC chip on a first side of the interposer; and
    mounting a second IC chip on a second side of the interposer.

10. The method of claim 7, further comprising:
    coupling the IC package electrically to the substrate via at least one of wire bonding connections, plated connections, ball-grid array connections.

11. The method of claim 7, wherein forming the substrate of the PCB with the opening portion that is dimensioned to accommodate IC package further comprises at least one of:
    forming the substrate of the PCB with a through opening portion; and
    forming the substrate of the PCB with a partial opening portion.

12. The method of claim 8, wherein
    forming the substrate of the PCB with a partial opening;
    forming conductive lands in a layer of the PCB underlying the partial opening; and
    disposing the IC package into the partial opening with solder balls of the IC package being electrically coupled with the conductive lands in the layer of the PCB underlying the partial opening.

13. An integrated circuit (IC) package, comprising:
    a first integrated circuit (IC) chip mounted on a first side of an interposer with an outline portion of the interposer that is notched and at least partially plated to form conductive components with dimensions being fit-table for disposing into an opening on a printed circuit board (PCB) substrate; and
    the plurality of conductive components disposed on the interposer configured for electrically coupling the IC package with the PCB substrate, wherein when the IC package is disposed and assembled in the opening formed in the PCB substrate, a thickness of the assembled PCB is less than a thickness sum of the IC package and the PCB substrate.

14. The IC package of claim 13, wherein the IC package includes a second IC chip mounted on a second side of the interposer.

15. The IC package of claim 13, wherein the conductive components are at least one of wire bonding connections, plated connections, and ball-grid array connections.

16. The IC package of claim 13, wherein the opening portion is a through opening or a partial opening.

17. The IC package of claim 13, wherein the opening portion is a partial opening, the conductive components are solder balls disposed on a second side of the interposer, and the interposer is configured to fit into the partial opening with the solder balls being electrically coupled to a layer of the PCB substrate underlying the partial opening.

* * * * *